US012627316B2

(12) United States Patent
Lu et al.

(10) Patent No.: US 12,627,316 B2
(45) Date of Patent: May 12, 2026

(54) DATA PROCESSING METHOD AND DATA PROCESSING APPARATUS

(71) Applicant: Shenzhen Corerain Technologies Co., Ltd., Shenzhen (CN)

(72) Inventors: Chenchen Lu, Shenzhen (CN); Haiqi Tang, Shenzhen (CN); Kuen Hung Tsoi, Shenzhen (CN); Xinyu Niu, Shenzhen (CN)

(73) Assignee: Shenzhen Corerain Technologies Co., Ltd., Shenzhen (CN)

( * ) Notice: Subject to any disclaimer, the term of this patent is extended or adjusted under 35 U.S.C. 154(b) by 169 days.

(21) Appl. No.: 18/650,118

(22) Filed: Apr. 30, 2024

(65) Prior Publication Data

US 2025/0192801 A1      Jun. 12, 2025

(30) Foreign Application Priority Data

Dec. 11, 2023    (CN) .......................... 202311685329.1

(51) Int. Cl.
*H03M 7/46* (2006.01)
*H03M 7/30* (2006.01)
(52) U.S. Cl.
CPC ........... *H03M 7/46* (2013.01); *H03M 7/3064* (2013.01)
(58) Field of Classification Search
CPC ..... H03M 7/46; H03M 7/6011; H03M 7/3064
See application file for complete search history.

(56) References Cited

U.S. PATENT DOCUMENTS

| | | | | |
|---|---|---|---|---|
| 5,302,949 A * | 4/1994 | Yoshinari | ................. | H04N 7/54 |
| | | | | 358/1.9 |
| 5,838,266 A * | 11/1998 | Houle | ..................... | H03M 7/42 |
| | | | | 341/51 |
| 6,055,272 A * | 4/2000 | Kim | ........................ | H04N 19/93 |
| | | | | 382/245 |
| 6,331,826 B1 * | 12/2001 | Wagner | ................... | G06T 9/005 |
| | | | | 341/59 |
| 6,339,614 B1 * | 1/2002 | Gupta | .................... | H04N 19/93 |
| | | | | 375/E7.093 |
| 6,388,588 B2 * | 5/2002 | Kitamura | ............... | H04N 19/48 |
| | | | | 375/E7.206 |

(Continued)

FOREIGN PATENT DOCUMENTS

CN            111294057 A        6/2020

*Primary Examiner* — Lam T Mai

(57) ABSTRACT

The present invention proposes a data processing method, a data processing apparatus, an electronic device, and a computer-readable storage medium. The method includes: in response to a data processing instruction, segmenting an original data to obtain multiple data segments of the original data to enable parallel processing of the multiple data segments, wherein the multiple data segments includes a first data segment; determining whether the first data segment is suitable for using a preset run-length encoding; and when the first data segment is suitable for using the run-length encoding, using the run-length encoding to perform a run-length encoding processing on the first data segment. According to some embodiments, the original data is initially segmented into multiple data segments, and each data segment can be processed independently and concurrently, thereby enhancing the speed of data compression processing.

13 Claims, 6 Drawing Sheets

(56)     References Cited

U.S. PATENT DOCUMENTS

| | | | |
|---|---|---|---|
| 6,661,839 B1 * | 12/2003 | Ishida | G01R 31/31921 |
| | | | 375/240 |
| 7,623,047 B2 * | 11/2009 | Ordentlich | H03M 7/40 |
| | | | 341/51 |
| 9,083,977 B2 * | 7/2015 | Du | H04N 19/423 |
| 9,647,685 B1 * | 5/2017 | Lachheb | H03M 7/46 |
| 9,654,140 B1 * | 5/2017 | Klum | G06F 21/62 |
| 12,160,253 B2 * | 12/2024 | Xie | H03M 7/6011 |
| 2002/0075532 A1 * | 6/2002 | Shiraishi | G06T 9/005 |
| | | | 358/539 |
| 2005/0249427 A1 * | 11/2005 | Shiraishi | H03M 7/46 |
| | | | 382/245 |
| 2008/0046698 A1 * | 2/2008 | Ahuja | H04N 19/42 |
| | | | 712/E9.032 |
| 2009/0112897 A1 * | 4/2009 | Ordentlich | H03M 7/40 |
| 2013/0082850 A1 * | 4/2013 | Takeshima | H03M 7/6094 |
| | | | 341/50 |
| 2013/0257634 A1 * | 10/2013 | Wang | H03M 7/46 |
| | | | 341/67 |
| 2014/0146872 A1 * | 5/2014 | Du | H04N 19/423 |
| | | | 375/240.2 |
| 2015/0113286 A1 * | 4/2015 | Wiener | H04L 9/0637 |
| | | | 713/189 |

* cited by examiner

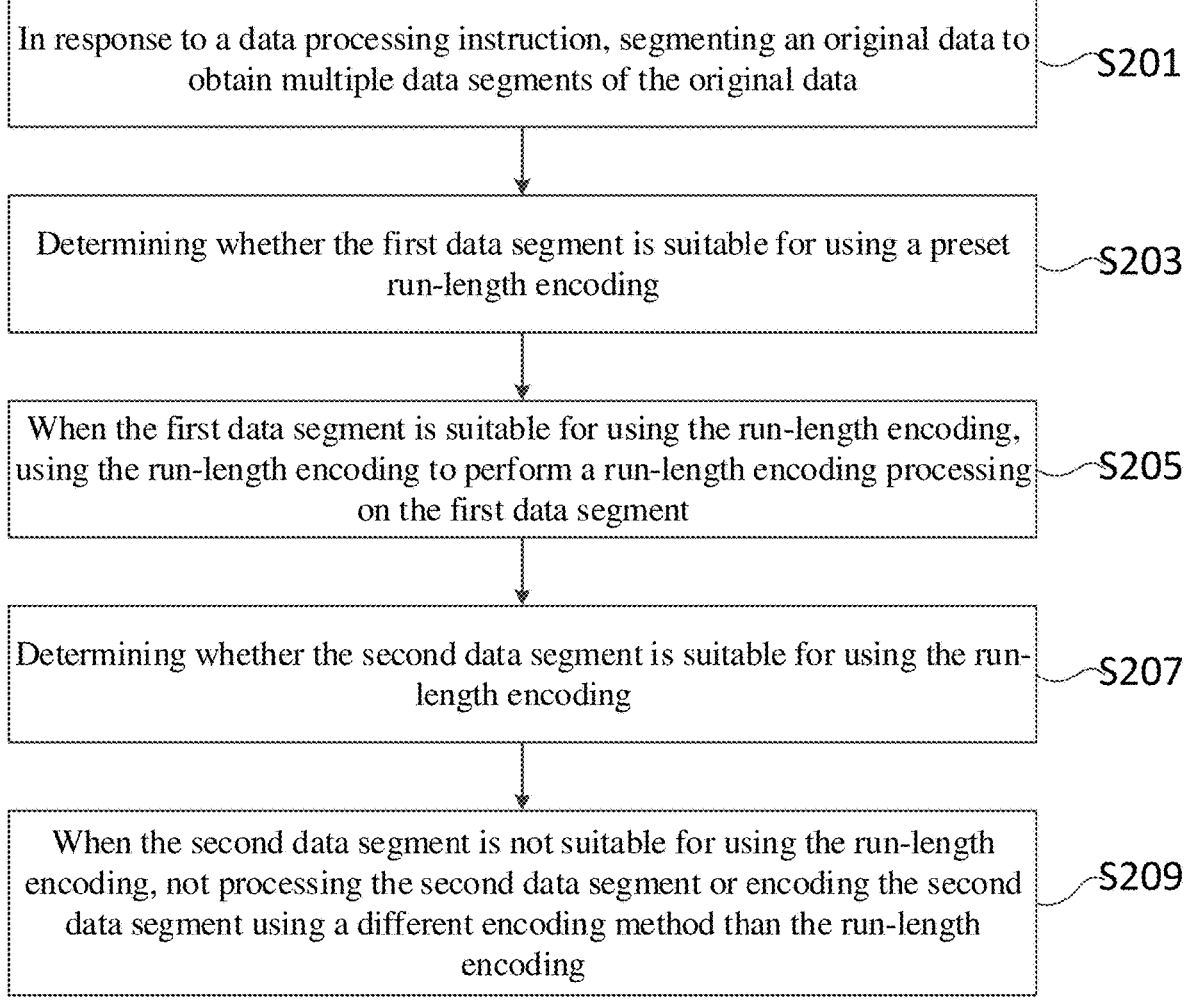

In response to a data processing instruction, segmenting an original data to obtain multiple data segments of the original data — S201

Determining whether the first data segment is suitable for using a preset run-length encoding — S203

When the first data segment is suitable for using the run-length encoding, using the run-length encoding to perform a run-length encoding processing on the first data segment — S205

Determining whether the second data segment is suitable for using the run-length encoding — S207

When the second data segment is not suitable for using the run-length encoding, not processing the second data segment or encoding the second data segment using a different encoding method than the run-length encoding — S209

FIG. 3

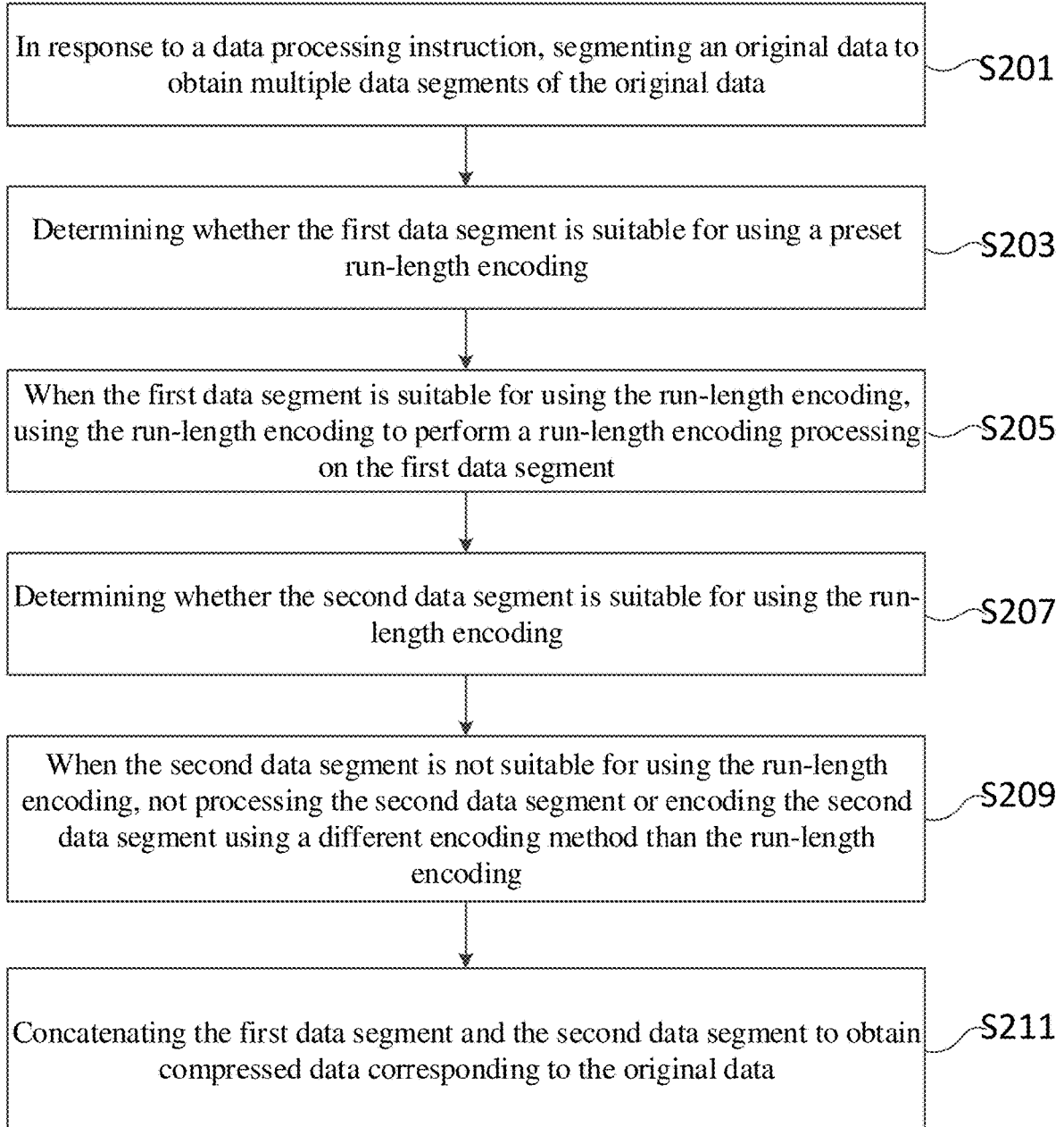

In response to a data processing instruction, segmenting an original data to obtain multiple data segments of the original data — S201

Determining whether the first data segment is suitable for using a preset run-length encoding — S203

When the first data segment is suitable for using the run-length encoding, using the run-length encoding to perform a run-length encoding processing on the first data segment — S205

Determining whether the second data segment is suitable for using the run-length encoding — S207

When the second data segment is not suitable for using the run-length encoding, not processing the second data segment or encoding the second data segment using a different encoding method than the run-length encoding — S209

Concatenating the first data segment and the second data segment to obtain compressed data corresponding to the original data — S211

FIG. 4

Determining whether the first data segment and the second data segment are both processed by using the run-length encoding or not — S2111

Not

When one and only one of the first data segment and the second data segment is processed using the run-length encoding, the positions of the first data segment processed using the run-length encoding are marked — S2113

Yes

When both the first data segment and the second data segment are processed using the run-length encoding or neither is processed using the run-length encoding, the first data segment and the second data segment are directly concatenated — S2115

FIG. 5

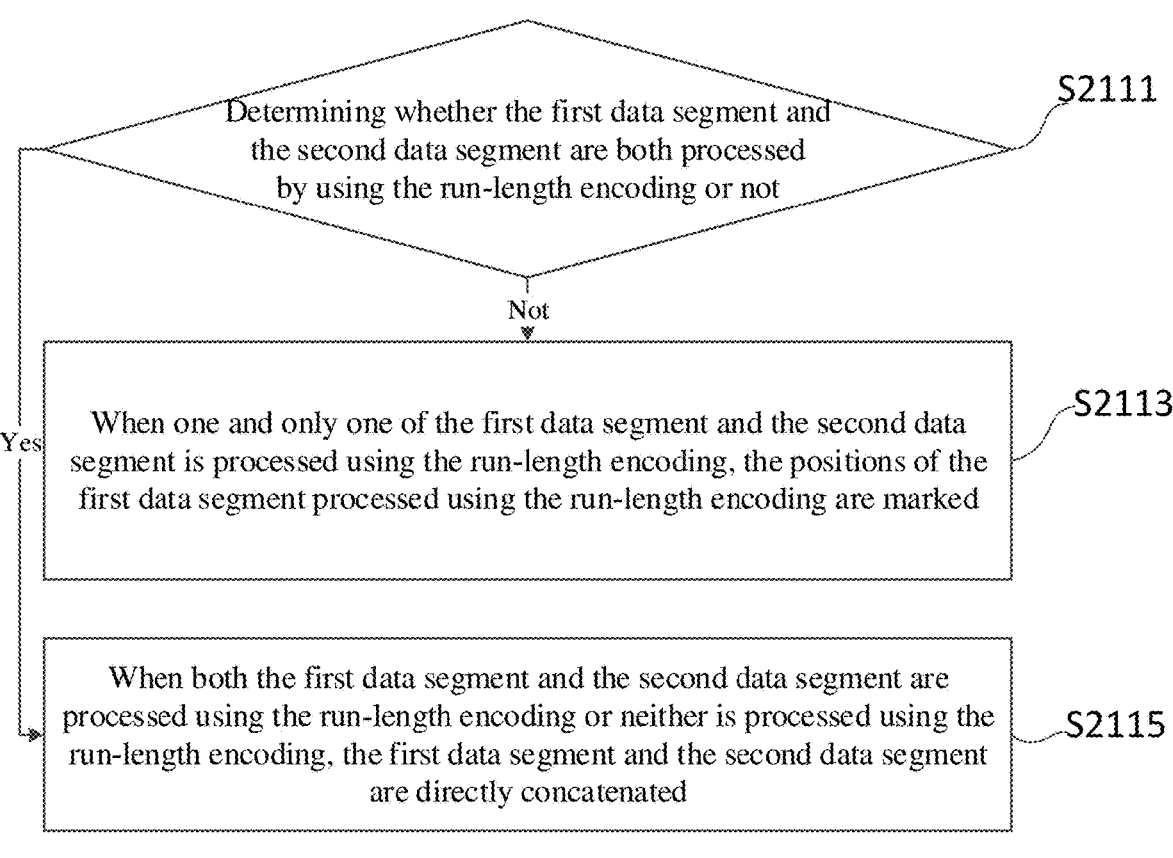

After run-length encoding

FIG. 6

After run-length encoding

Not use run-length encoding

Segmenting unit 901

Run-length encoding processing
confirmation unit 903

Run-length encoding unit 905

DATA PROCESSING METHOD AND DATA PROCESSING APPARATUS

CROSS REFERENCE TO RELATED APPLICATIONS

The present application claims the benefit of Chinese Patent Application No. 202311685329.1 filed on Dec. 11, 2023, the contents of which are incorporated herein by reference in their entirety.

TECHNICAL FIELD

The present invention relates to the field of data transmission, and in particular, to a data processing method and data processing apparatus, electronic device.

BACKGROUND TECHNIQUE

No matter how fast the transmission speed of computers and networks is, users always require a faster experience. In order to reduce the capacity of transmitted data, we usually compress the data. There are numerous data compression algorithms, some lossless and some lossy, but their primary objective is to minimize storage space and transmission volume.

Run-length compression coding replaces consecutive occurrences of the same data element with the element itself and a count of how many times it appears. Even if the current data element only appears once, it still needs to be represented by two parts: {K, n}. Consequently, if the number of repetitions of elements in the original data is relatively small, the encoded data will be larger due to the addition of the extra "n", which cannot achieve the purpose of data compression. In particular, if certain segments of data elements to be compressed have a high repeating frequency while other segments repeat less frequently, using run-length encoding directly might result in a larger data volume after encoding than before compression.

Additionally, when performing run-length compression encoding on the original data, the current method involves comparing each original data with its predecessors and successors individually to determine whether they are identical. While this encoding technique is straightforward, it can only process one data at a time, leading to slower processing speeds and being disadvantageous for the parallel processing of multiple data.

Contents of the Invention

The present invention aims to propose a data processing method, a data processing apparatus, an electronic device to address the issue of poor compression efficiency of current run-length coding.

According to an aspect of the present invention, a data processing method is proposed, including: in response to a data processing instruction, segmenting an original data to obtain multiple data segments of the original data to enable parallel processing of the multiple data segments, wherein the multiple data segments include a first data segment; determining whether the first data segment is suitable for using a preset run-length encoding; and when the first data segment is suitable for using the run-length encoding, using the run-length encoding to perform a run-length encoding processing on the first data segment.

According to some embodiments, the step of in response to a data processing instruction, segmenting an original data to obtain multiple data segments of the original data includes: segmenting the original data according to a length of the original data; or segmenting the original data according to a data distribution of the original data; or segmenting the original data according to a preset segmentation constant.

According to some embodiments, the multiple data segments further include a second data segment, and the data processing method further includes: determining whether the second data segment is suitable for using the run-length encoding; and when the second data segment is not suitable for using the run-length encoding, not processing the second data segment or encoding the second data segment using a different encoding method than the run-length encoding.

According to some embodiments, the method further includes: concatenating the first data segment and the second data segment.

According to some embodiments, the step of concatenating the first data segment and the second data segment includes: when both the first data segment and the second data segment are processed using or not using the run-length encoding, directly concatenating the first data segment and the second data segment.

According to some embodiments, the step of concatenating the first data segment and the second data segment includes: when only one of the first data segment and the second data segment is processed using the run-length encoding, marking a position of the first data segment after the run-length encoding processing.

According to some embodiments, the step of marking a position of the first data segment after the run-length encoding processing includes: adding a special character before and after the position of the first data segment after the run-length encoding processing to mark the position of the first data segment after the run-length encoding processing; or storing a position data of the first data segment after the run-length encoding processing to mark the position of the first data segment after the run-length encoding processing.

According to an aspect of the present invention, a data processing apparatus is proposed, including: a segmenting unit, configured to in response to a data processing instruction, segment an original data to obtain multiple data segments of the original data to enable parallel processing of the multiple data segments, wherein the multiple data segments include a first data segment; a run-length encoding processing confirmation unit, configured to determine whether the first data segment is suitable for using a preset run-length encoding; and a run-length encoding unit, configured to when the first data segment is suitable for using the run-length encoding, use the run-length encoding to perform a run-length encoding processing on the first data segment.

According to an aspect of the present invention, an electronic device is proposed, including: a processor; and a memory storing a computer program that, when executed by the processor, causes the processor to execute the data processing method in any one of the above embodiments.

According to an aspect of the present invention, a computer-readable storage medium is proposed, storing a computer-readable instruction that, when executed by a processor, causes the processor to execute the data processing method in any one of the above embodiments.

According to embodiments of the present invention, the original data is segmented into multiple data segments firstly, and each data segment can be processed independently and concurrently, thereby enhancing the speed of data compression processing. In addition, it is judged whether each data segment is suitable for compression through run-length coding, and only segments deemed suitable for run-length coding are processed using this method, thereby optimizing data compression efficiency.

It should be understood that the above general description and the following detailed description are only exemplary and do not limit the present invention.

DESCRIPTION OF THE DRAWINGS

In order to explain the technical solutions in the embodiments of the present invention more clearly, the drawings needed to be used in the description of the embodiments will be briefly introduced below. The above and other objects, features and advantages of the present invention will become more apparent by describing in detail exemplary embodiments thereof with reference to the accompanying drawings.

FIG. 3 shows a flow chart of another data processing method according to an exemplary embodiment of the present invention.

FIG. 4 shows a flow chart of another data processing method according to an exemplary embodiment of the present invention.

FIG. 5 shows a flow chart of another data processing method according to an exemplary embodiment of the present invention.

FIG. 6 shows a schematic diagram of an implementation process using run-length encoding processing.

DETAILED DESCRIPTION

Figure 1:
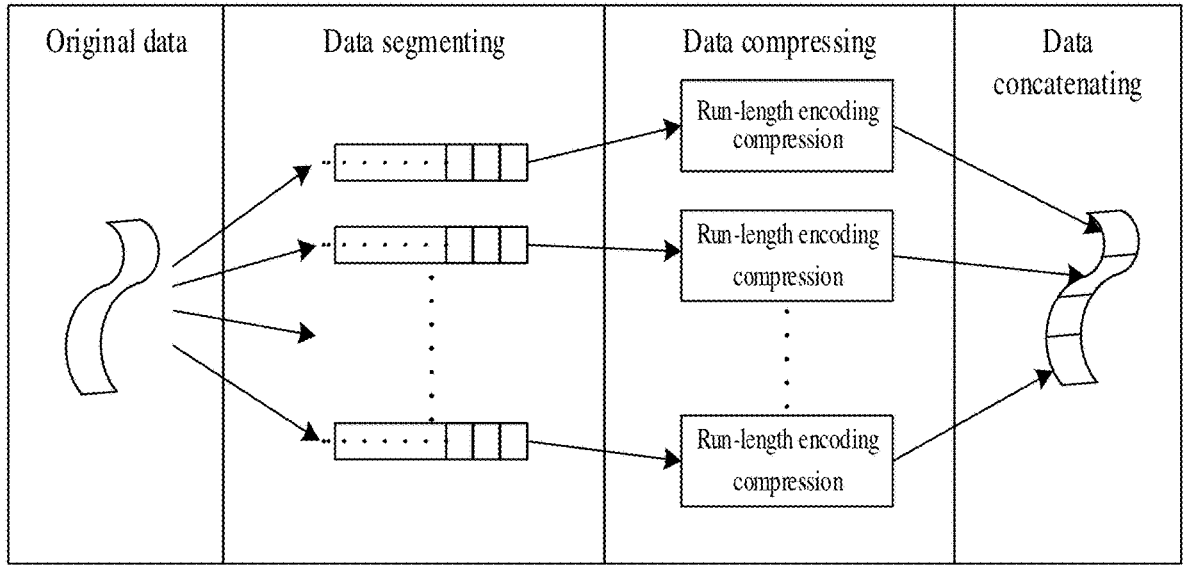
FIG. 1 shows a schematic diagram of a data processing method according to an exemplary embodiment of the present invention.

Exemplary embodiments will now be described more fully with reference to the accompanying drawings. However, exemplary embodiments may be embodied in various forms and should not be construed as being limited to the embodiments described herein. Instead, these embodiments are provided so that this disclosure will be thorough and complete, and will fully convey the concepts of the exemplary embodiments to those skilled in the art. The same figures shown in the drawings represent the same or similar parts, and thus their repeated description will be omitted.

The described features, structures or characteristics may be combined in any suitable manner in one or more embodiments. In the following description, numerous specific details are provided to provide a thorough understanding of embodiments of the present disclosure. However, those skilled in the art will appreciate that the technical solutions of the present disclosure may be practiced without one or more of these specific details, or other manners, components, materials, devices, operations, etc. may be employed.

In these cases, well-known structures, methods, devices, implementations, materials, or operations will not be shown or described in detail.

The flowcharts shown in the drawings are only illustrative, and do not necessarily include all contents and operations/steps, nor must they be performed in the order described. For example, some operations/steps can be further decomposed, and some operations/steps can be combined or partially combined. Therefore, the actual order of execution may vary depending on the specific situation.

The terms "first," "second," and so on in the description, claims, and accompanying drawings of the present invention are employed solely to distinguish between different objects and not to indicate a specific sequence. Additionally, the terms "including" and "having" and their variations are intended to encompass non-exclusive inclusion. For example, a process, method, system, product, or device that incorporates a series of steps or units is not limited to those specifically enumerated but may optionally include additional steps or units not listed, or optionally also includes other steps or units inherent to such processes, methods, products or devices.

Run-length encoding is a very simple lossless data compression algorithm. The algorithm is implemented by replacing the consecutive data parts in the string with the current data element and the number of consecutive occurrences of the element. For convenience of description, the data after run-length encoding is expressed as $\{K, n\}$, where K is the current data element and n is the number of times the element is repeated. For example, the original string is "aaaaaaaaaabbbaxxxxyyyzyx", the length of the string is 24, and there are many repeated parts in the string. After the application of the run-length algorithm, the string "a10b3a1x4y3z1y1x1" is obtained. The length of the string is 17, which is about 70% of the original string length.

As mentioned before, run-length compression coding replaces consecutive occurrences of the same data element with the element itself and a count of how many times it appears. Even if the current data element only appears once, it still needs to be represented by two parts: $\{K, n\}$. For example, when the original string is "abcdabcdabcdabcd", after run-length encoding, the string "a1b1c1d1a1b1c1d1a1b1c1d1a1b1c1d1" is obtained, and the string length changes from 16 to 20. It can be seen that when the number of repetitions of elements in the original data is relatively small, adding extra "n", however, will make the encoded data even larger, failing to fulfill its purpose of compressing data.

Additionally, when performing run-length compression encoding on the original data, the current method involves comparing each original data with its predecessors and successors individually to determine whether they are identical. While this encoding technique is straightforward, it can only process one data at a time, leading to slower processing speeds and being disadvantageous for the parallel processing of multiple data.

FIG. 1 shows a schematic diagram of a data processing method according to an exemplary embodiment of the present invention. As shown in FIG. 1, the original data is initially segmented into several segments, and then each segment is independently and concurrently processed with run-length encoding. During the run-length encoding process, segments that would experience an increase in data volume after run-length encoding are identified, and the encoding process is subsequently omitted for these segments. Instead, either the data segment is directly used or alternative compression methods are employed to compress it. Finally, the multiple processed fragment data are merged together to form the final compressed data.

According to the embodiment shown in FIG. 1, it is determined whether each data segment is suitable for compression through run-length coding. Only when the data segment is suitable for compression through run-length coding is run-length encoding process applied, addressing the issue of potential data expansion after run-length encoding compression, thereby enhancing the data compression efficiency. At the same time, each data segment can be processed independently and concurrently, thereby accelerating the speed of data compression processing.

Specific embodiments according to the present invention will be described in detail below with reference to the accompanying drawings.

Figure 2:
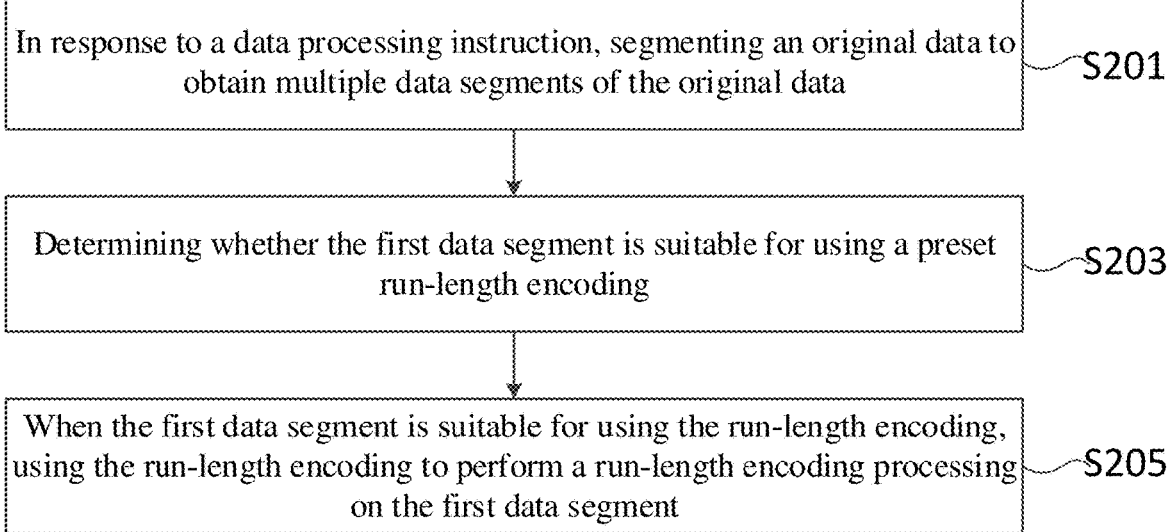
FIG. 2 shows a flow chart of a data processing method according to an exemplary embodiment of the present invention.

FIG. 2 shows a flow chart of a data processing method according to an exemplary embodiment of the present invention. The method shown in FIG. 2 includes steps S201, S203 and S205.

In step S201, in response to the data processing instruction, the original data is segmented to obtain multiple data segments of the original data.

According to an embodiment of the present invention, multiple data segments can be processed in parallel through step S201, wherein the multiple data segments include a first data segment.

In some embodiments, the original data is segmented according to the length of the original data.

In a particular embodiment, the length of the original data is initially calculated. If it is possible to segment the original data into equal parts, then the original data is segmented accordingly.

Take the string "abcdabcdabcdabcd" as an example. The length of the string is 16, and the defined data segment length is 4. Upon segmenting the string, four equal-length data segments are obtained.

According to some other embodiments, the original data is segmented according to a preset segmentation constant.

Take the string "abcdabc" as an example. The length of the string is 7, and the preset data segment length is 4, Upon segmenting the string, data segments "abcd" and "abc" are obtained.

According to some other embodiments, the original data is segmented according to the data distribution of the original data.

Take the string "aaaabbbccabc" as an example. Its sub-string "aaaabbbcc" has duplicate characters, and its string "abc" does not have duplicate characters. Therefore, the string "aaaabbbccabc" can be segmented into "aaaabbbcc" and "abc".

It is easy to understand that when processing original data, the more data segments there are, the more parallel processing channels available, and the shorter the length of each data segment becomes. Therefore, the processing speed will be faster, but it also means that this requires consuming increased hardware resources. Consequently, the present invention does not limit the method of segmenting the original data. Any method capable of segmenting the original data into multiple segments is suitable for this embodiment. Additionally, it should be noted that when segmenting the original data, a combination of segmentation methods can be chosen depending on the characteristics of the string's character combinations.

Take the string "aaaabbbccabc" as an example. Firstly, the string is segmented into 'aaaabbbcc' and 'abc' based on its distribution characteristics. Subsequently, 'aaaabbbcc' is further segmented into 'aaa', 'abb', and 'bcc' based on the predefined data segment length.

In step S201, by segmenting the original data into multiple data segments, subsequent steps can perform data processing on each data segment in a parallel manner, thereby enhancing the speed of data compression processing.

According to the embodiment of the present invention, after obtaining multiple data segments in step S201, step S203 is executed in parallel.

In step S203, it is determined whether the first data segment is suitable for using preset run-length encoding.

As mentioned previously, run-length encoding is suitable for situations where elements appear continuously but is not suitable for situations where characters are repeated infrequently. Therefore, step S203 is employed to select sequences of characters suitable for run-length encoding processing, and the first data segment undergoes run-length encoding processing, the efficiency of data compression.

In step S205, when the first data segment is suitable for the run-length coding, the run-length coding processing is performed on it.

After selecting the first data segment suitable for run-length coding in step S203, the run-length coding processing is performed on the first data segment using the method shown in step S205, to achieve data compression of the first data segment.

According to the method shown in FIG. 2, the original data is initially segmented into multiple data segments, enabling independent and parallel processing of each segment, thereby improving the speed of data compression. Additionally, it is judged whether each data segment is suitable for compression through run-length encoding. Only when a data segment is suitable for compression through run-length encoding, the run-length coding processing is performed on the data segment, thereby enhancing the efficiency of data compression.

FIG. 3 shows a flow chart of another data processing method according to an exemplary embodiment of the present invention. As shown in FIG. 3, in addition to steps S201 to S205, the method shown in FIG. 3 also includes steps S207 and S209.

The description below will focus solely on the differences between the embodiments shown in FIG. 3 and FIG. 2, omitting the detailed discussion of their similarities for brevity.

According to the embodiment shown in FIG. 3, the multiple data segments further include a second data segment, and in step S207, it is determined whether the second data segment is suitable for using the run-length encoding.

As mentioned before, run-length encoding is suitable for situations where elements appear continuously, but is not suitable for situations where characters are repeated infrequently. Therefore, through step S207, unsuitable sequences of characters for run-length encoding processing are filtered out, thereby minimizing the negative impact on data compression efficiency resulting from attempting run-length encoding processing on the second data segment.

In step S209, when the second data segment is not suitable for using the run-length coding, the second data segment is not processed or is encoded using a coding method different from the run-length coding.

As shown in the embodiment in FIG. 3, each data segment is evaluated for its suitability for compression through run-length coding. Data segments deemed unsuitable for run-length coding are either left unprocessed or encoded using alternative methods, thereby circumventing the need for run-length encoding on unsuitable strings and mitigating the negative impact on data compression efficiency caused by applying run-length encoding to strings with limited character repetitions.

FIG. 4 shows a flow chart of another data processing method according to an exemplary embodiment of the present invention. As shown in FIG. 4, in addition to steps S201 to S209, based on the method shown in FIG. 3, the method as shown in FIG. 4 also includes step S211. The description below will focus solely on the differences between the embodiments shown in FIG. 4 and FIG. 3, omitting the detailed discussion of their similarities for brevity.

As shown in FIG. 4, in step S211, the first data segment and the second data segment are concatenated to obtain compressed data corresponding to the original data.

FIG. 5 shows a flow chart of another data processing method according to an exemplary embodiment of the present invention. As shown in FIG. 5, step S211 includes sub-steps S2111, S2113 and S2115.

According to the embodiment shown in FIG. 5, the first data segment and the second data segment are adjacent data segments.

In sub-step S2111, it is determined whether the first data segment and the second data segment are both processed by using the run-length encoding or not.

In sub-step S2113, when one and only one of the first data segment and the second data segment is processed using the run-length encoding, the positions of first data segment processed using the run-length encoding are marked.

In step S2115, when both the first data segment and the second data segment are processed using the run-length encoding or neither is processed using the run-length encoding, the first data segment and the second data segment are directly concatenated.

According to the embodiment shown in FIG. 5, it is determined whether the encoding formats of two adjacent data segments are the same. If they are the same, no special processing is required.

If they are different, the position of one of the data segments needs to be recorded so that different decoding methods are switched according to the positions of the two data segments during data decompression.

It should be noted here that the present invention does not limit the way in which data segments are marked. The way in which the position of the first data segment after run-length coding is marked includes but is not limited to adding a special character before and after the position of the first data segment after the run-length encoding processing to mark the position of the first data segment after the run-length encoding processing; or storing a position data of the first data segment after the run-length encoding processing to mark the position of the first data segment after the run-length encoding processing.

FIG. 6 shows a schematic diagram of the implementation process using run-length encoding. As shown in FIG. 6, the string 'aaaaaaadabcdabcd' starts with a series of repeated characters. Using run-length encoding, the first seven characters can be compressed into just two. However, the subsequent data is less repetitive, and encoding the next nine characters using run-length encoding results in 18 characters. If the data is not segmented and run-length encoding is applied directly, the resulting encoded string would be 20 characters long. It can be seen that in this case, run-length encoding not only fails to achieve compression but actually results in data expansion.

Figures 7, 8, 9:
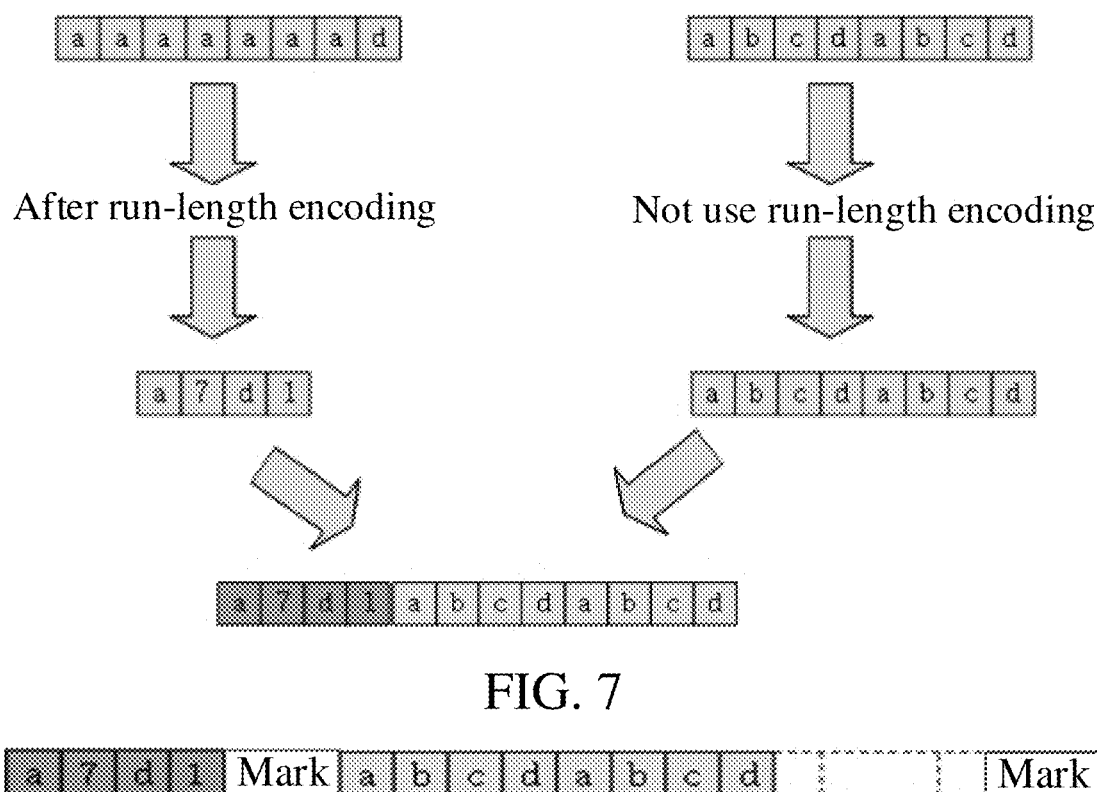
FIG. 7 shows a process schematic diagram of a data processing method according to an exemplary embodiment of the present invention.
FIG. 8 shows a schematic diagram of a mark according to an exemplary embodiment of the present invention.
FIG. 9 shows a block diagram of a data processing apparatus according to an exemplary embodiment of the present invention.

FIG. 7 shows a process schematic diagram of a data processing method according to an exemplary embodiment of the present invention. As shown in FIG. 7, for the string "aaaaaaadabcdabcd", initially, it is segmented into data segments "aaaaaaad" and "abcdabcd". Subsequently, the data segment "aaaaaaad" is processed using run-length encoding, resulting in "a7d1". The string "abcdabcd" remains unprocessed with run-length encoding. Finally the string "a7d1abcdabcd" is obtained. If the way of adding a special character before and after the position of the first data segment after the run-length encoding processing to mark the position of the first data segment after the run-length encoding processing is used, the string "mark a7d mark abcdabcd" is obtained. If the way of storing a position data of the first data segment after the run-length encoding processing to mark the position of the first data segment after the run-length encoding processing is used, since the starting positions of "a7d1" in "a7d1abcdabcd" are 1 and 4 respectively, data 1 and 4 are stored separately. When decompressing string "a7d1abcdabcd", according to data 1 and 4, first the string "a7d1" is taken out for decompression to obtain the string "aaaaaaad", "abcdabcd" is not processed, and "aaaaaaad" and "abcdabcd" are merged to obtain the original data "aaaaaaadabcdabcd".

According to some embodiments, the mark data may be stored together with the original data processed by run-length encoding. As shown in FIG. 8, for the string "aaaaaaadabcdabcd", after processing it according to the exemplary embodiment of the present invention, the string "a7d1abcdabcd" is obtained, and the mark data can be stored together with the original data after run-length encoding processing, so as to mark the stored data segments processed by run-length encoding. For example, the data "a7d1 mark abcdabcd . . . mark" is stored in the manner described in FIG. 8. In other embodiments, the string "aaaaaaadabcdabcd" can also be stored in the manner of "mark a7d1 mark abcdabcd . . . mark".

In a specific embodiment, only the position where the encoding mode is switched may be marked. For example, for the string "aaaaaaadabcdabcd", after processing it according to the exemplary embodiment of the present invention, the string "a7d1 mark abcdabcd" is obtained. It can also be seen from this that the end position of the string "a7d1" is the starting position of the string "abcdabcd". Therefore, only a single marker is required. In some embodiments, after all the data is concatenated, a header and a tail for the data packet may be added before and after the entire data to mark the entire data.

The above mainly introduces the embodiments of the present invention from the perspective of methods. It should be easily recognized by those skilled in the art that the present invention can be implemented in the form of hardware or a combination of hardware and computer software by combining the operations or steps of each example described in the embodiments disclosed herein. Those skilled in the art may use different ways to implement the described functions for each specific operation or method, and such implementations should not be considered to be beyond the scope of the present invention.

Device embodiments of the present invention are described below. For details not explained in the device embodiments of the present invention, reference may be made to the method embodiments of the present invention.

FIG. 9 shows a block diagram of a data processing apparatus according to an exemplary embodiment of the present invention. The device in FIG. 9 includes a segmenting unit 901, a run-length encoding processing confirmation unit 903, and a run-length encoding unit 905. The segmenting unit 901 is used to in response to a data processing instruction, segment an original data to obtain multiple data segments of the original data to enable parallel processing of the multiple data segments, wherein the multiple data segments includes a first data segment; the run-length encoding processing confirmation unit 903 is used to determine whether the first data segment is suitable for using a preset run-length encoding; and the run-length encoding unit 905 is used to when the first data segment is suitable for using the run-length encoding, use the run-length encoding to perform a run-length encoding processing on the first data segment.

Figure 10:
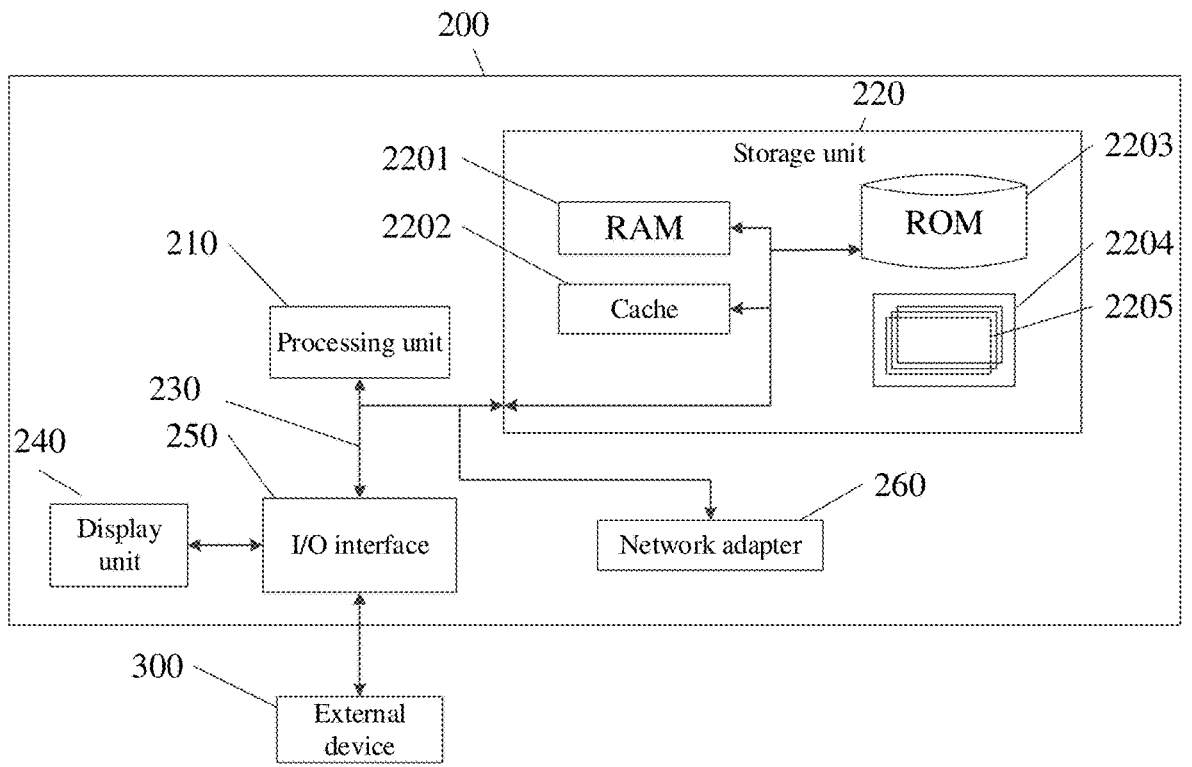
FIG. 10 shows an electronic device according to an exemplary embodiment of the present invention.

FIG. 10 shows an electronic device according to an exemplary embodiment of the present invention. The electronic device 200 according to this embodiment of the present invention is described below with reference to FIG. 10. The electronic device 200 shown in FIG. 10 is only an example and should not bring any limitations to the functions and scope of use of the embodiments of the present invention.

As shown in FIG. 10, electronic device 200 is embodied in the form of a general computing device. The components of the electronic device 200 may include, but are not limited to: at least one processing unit 210, at least one storage unit 220, a bus 230 connecting different system components (including the storage unit 220 and the processing unit 210), a display unit 240, and the like.

The storage unit stores program code, and the program code can be executed by the processing unit 210, thereby enabling the processing unit 210 to execute the methods described in this specification according to various exemplary embodiments of the present invention. For example, the processing unit 210 may perform the method as shown in FIG. 2.

The storage unit 220 may include a readable medium in the form of a volatile storage unit, such as random access memory (RAM) 2201 and/or cache memory 2202. It may further include read-only memory (ROM) 2203.

The storage unit 220 may also include a program/utility tool 2204, including a set of program modules 2205 that include, but are not limited to: an operating system, one or more application programs, other program modules, and program data. These examples, individually or in combination, may include the implementation of a network environment.

Bus 230 may represent one or multiple types of bus structures, including a memory bus or memory controller, a peripheral bus, a graphics acceleration port, a processing unit, or a local area bus using any bus structure among various bus structures.

Electronic device 200 may also communicate with one or more external devices 300 (e.g., keyboard, pointing device, Bluetooth device, etc.), may also communicate with one or more devices that enable a user to interact with electronic device 200, and/or with any device (e.g., router, modem, etc.) that enables the electronic device 200 to communicate with one or more other computing devices. This communication may occur through input/output (I/O) interface 250. Furthermore, the electronic device 200 may also communicate with one or more networks (e.g., a local area network (LAN), a wide area network (WAN), and/or a public network, such as the Internet) through the network adapter 260. Network adapter 260 may communicate with other modules within electronic device 200 via bus 230. It should be appreciated that, although not shown in the drawings, other hardware and/or software modules may be employed in conjunction with electronic device 200, including but not limited to: microcode, device drivers, redundant processing units, external disk drive arrays, RAID systems, tape drivers and data backup storage system, etc.

Through the above description of the embodiments, those skilled in the art can easily understand that the exemplary embodiments described here can be implemented by software, or can be implemented by software combined with necessary hardware. The technical solution according to the embodiment of the present invention can be embodied in the form of a software product. The software product can be stored in a non-volatile storage medium (such as a CD-ROM, USB drive, mobile hard disk, etc.) or in the network, including a plurality of instructions to cause a computation device (such as a personal computer, a server, a network device, etc.) to execute the above method according to an embodiment of the present invention.

A software product may be embodied in any combination of one or more readable media. A readable medium may be either a readable signal medium or a readable storage medium. The readable storage medium may be, for example, but not limited to, an electrical, magnetic, optical, electromagnetic, infrared, or semiconductor system, apparatus or device, or any combination thereof. More specific examples (non-exhaustive list) of readable storage medium include: electrical connection with one or more conductors, portable disk, hard disk, random access memory (RAM), read only memory (ROM), erasable programmable read-only memory (EPROM or flash memory), optical fiber, portable compact disk read-only memory (CD-ROM), optical storage device, magnetic storage device, or any suitable combination thereof.

A computer-readable storage medium may include a data signal propagating in baseband or as part of a carrier wave carrying the readable program code therein. Such propagated data signals may take various forms, including but not limited to electromagnetic signals, optical signals, or any suitable combination thereof. A readable storage medium may also be any readable medium other than a readable storage medium, capable of transmitting, propagating transporting the program for use by or in connection with an instruction execution system, apparatus, or device. Program code resident on a readable storage medium may be transmitted using any suitable medium, including but not limited to wireless, wired, optical cable, RF, etc., or any suitable combination thereof.

Program code for performing the operations of the present invention may be written in any combination of one or more programming languages, including object-oriented programming languages such as Java, C++, etc., as well as conventional procedural programming language-such as "C" or a similar programming language. The program code may execute entirely on the user's computation device, partly on the user's device, as a stand-alone software package, partly on the user's computation device and partly on a remote computation device, or entirely on the remote computation device or server. In situations involving remote computation devices, the remote computation device may be connected to the user computation device through any type of network, including a local area network (LAN) or a wide area network (WAN), or may be connected to an external computing device (e.g., using Internet service providers to connect via the Internet).

The above-mentioned computer-readable medium carries one or more programs, which when the above-mentioned one or more programs are executed by a device, enabling the computer readable medium to implement the aforementioned functions.

Those skilled in the art may understand that the above-mentioned modules can be arranged within an apparatus according to the description of the embodiments, or can be modified accordingly within one or more apparatuses that are only different from this embodiment. The modules in the above embodiments may be consolidated into a single module, or further partitioned into multiple subordinate modules.

According to an embodiment of the present invention, a computer program is proposed, including a computer program or instructions. When the computer program or instructions are executed by a processor, the above-described method can be performed.

The embodiments of the present invention have been introduced in detail above. Specific examples are used in this disclosure to illustrate the principles and implementation modes of the present invention. The description of the above embodiments is only used to help understand the method and the core idea of the present invention. At the same time, any adaptations or variations made by those skilled in the art based on the ideas of the present invention and the specific implementation manner and application scope of the present invention shall fall within the scope of protection of the present invention. In summary, the contents of this description should not be construed as limitations of the present invention.

What is claimed is:

1. A data processing method, characterized by comprising:

in response to a data processing instruction, segmenting an original data to obtain multiple data segments of the original data to enable parallel processing of the multiple data segments, wherein the multiple data segments comprise a first data segment;

determining whether the first data segment is suitable for using a preset run-length encoding; and when the first data segment is suitable for using the run-length encoding, using the run-length encoding to perform a run-length encoding processing on the first data segment;

the multiple data segments further comprise a second data segment, and the data processing method further comprises:

determining whether the second data segment is suitable for using the run-length encoding; and when the second data segment is not suitable for using the run-length encoding, not processing the second data segment or encoding the second data segment using a different encoding method than the run-length encoding.

2. The data processing method according to claim 1, characterized in that the step of in response to a data processing instruction, segmenting an original data to obtain multiple data segments of the original data comprises:

segmenting the original data according to a length of the original data;

segmenting the original data according to a data distribution of the original data; or segmenting the original data according to a preset segmentation constant.

3. The data processing method according to claim 1, characterized by further comprising:

concatenating the first data segment and the second data segment.

4. The data processing method according to claim 3, characterized in that the step of concatenating the first data segment and the second data segment comprises:

when both the first data segment and the second data segment are processed using or not using the run-length encoding, directly concatenating the first data segment and the second data segment.

5. The data processing method according to claim 3, characterized in that the step of concatenating the first data segment and the second data segment comprises:

when only one of the first data segment and the second data segment is processed using the run-length encoding, marking a position of the first data segment after the run-length encoding processing.

6. The data processing method according to claim 5, characterized in that the step of marking a position of the first data segment after the run-length encoding processing comprises:

adding a special character before and after the position of the first data segment after the run-length encoding processing to mark the position of the first data segment after the run-length encoding processing; or storing a position data of the first data segment after the run-length encoding processing to mark the position of the first data segment after the run-length encoding processing.

7. An electronic device, comprising:

a processor; and a memory storing a computer program that, when executed by the processor, causes the processor to execute the data processing method as claimed in claim 1.

8. An electronic device, comprising:

a processor; and a memory storing a computer program that, when executed by the processor, causes the processor to execute the data processing method as claimed in claim 2.

9. An electronic device, comprising:

a processor; and a memory storing a computer program that, when executed by the processor, causes the processor to execute the data processing method as claimed in claim 3.

10. An electronic device, comprising:

a processor; and a memory storing a computer program that, when executed by the processor, causes the processor to execute the data processing method as claimed in claim 4.

11. An electronic device, comprising:

a processor; and a memory storing a computer program that, when executed by the processor, causes the processor to execute the data processing method as claimed in claim 5.

12. An electronic device, comprising:

a processor; and a memory storing a computer program that, when executed by the processor, causes the processor to execute the data processing method as claimed in claim 6.

13. A data processing apparatus, characterized by comprising:

a segmenting unit, configured to in response to a data processing instruction, segment an original data to obtain multiple data segments of the original data to enable parallel processing of the multiple data segments, wherein the multiple data segments comprise a first data segment and a second data segment;

a run-length encoding processing confirmation unit, configured to determine whether the first data segment is suitable for using a preset run-length encoding, and configured to determine whether the second data segment is suitable for using the run-length encoding; and a run-length encoding unit, configured to when the first data segment is suitable for using the run-length encoding, use the run-length encoding to perform a run-length encoding processing on the first data segment, and configured to when the second data segment is not suitable for using the run-length encoding, not process the second data segment or encoding the second data segment using a different encoding method than the run-length encoding.

* * * * *